(12) United States Patent
Fang

(10) Patent No.: US 11,282,778 B2
(45) Date of Patent: Mar. 22, 2022

(54) INTERPOSER BETWEEN A CONDUCTIVE SUBSTRATE AND PLURALITY OF SEMICONDUCTOR COMPONENTS

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 21 days.

(21) Appl. No.: 16/703,454

(22) Filed: Dec. 4, 2019

(65) Prior Publication Data

US 2021/0175163 A1 Jun. 10, 2021

(51) Int. Cl.

| H01L 23/02 | (2006.01) |
|---|---|
| H01L 23/34 | (2006.01) |
| H01L 23/48 | (2006.01) |
| H01L 23/28 | (2006.01) |
| H01L 21/00 | (2006.01) |
| H05K 7/00 | (2006.01) |
| H01R 9/00 | (2006.01) |
| H01L 23/498 | (2006.01) |
| H01L 21/48 | (2006.01) |
| H01L 23/00 | (2006.01) |

(Continued)

(52) U.S. Cl.
CPC ...... *H01L 23/49833* (2013.01); *H01L 21/481* (2013.01); *H01L 21/4853* (2013.01); *H01L 21/56* (2013.01); *H01L 21/6835* (2013.01); *H01L 23/3107* (2013.01); *H01L 23/3128* (2013.01); *H01L 23/49816* (2013.01); *H01L 23/49838* (2013.01); *H01L 23/5389* (2013.01); *H01L 24/17* (2013.01); *H01L 24/24* (2013.01); *H01L 24/97* (2013.01); *H01L 25/0657* (2013.01)

(58) Field of Classification Search
CPC ............ H01L 23/48933; H01L 21/481; H01L 21/4853; H01L 23/49816; H01L 21/56; H01L 2924/181; H01L 23/3128; H01L 25/0657; H01L 23/3107; H01L 24/17; H01L 21/6835; H01L 23/49838; H01L 24/25; H01L 23/5389; H01L 24/82; H01L 24/24

See application file for complete search history.

(56) References Cited

U.S. PATENT DOCUMENTS 8,836,118 B2 * 9/2014 Kang ...................... H01L 23/48
257/737
8,916,875 B2 * 12/2014 Lee .................... H01L 23/49838
257/48

(Continued)

*Primary Examiner* — Alonzo Chambliss
(74) *Attorney, Agent, or Firm* — Foley & Lardner LLP

(57) ABSTRACT

A semiconductor device package includes a redistribution structure, a conductive substrate stacked on the redistribution structure and an encapsulant encapsulating the redistribution structure and the conductive substrate. The encapsulant encapsulates a side surface of the conductive substrate. A method for manufacturing an electronic device package includes: providing a carrier, forming a redistribution structure on the carrier, mounting a conductive substrate on a first surface of the redistribution structure, forming a first encapsulant to encapsulate the first surface of the redistribution structure and a side surface of the conductive substrate, and removing the carrier.

21 Claims, 22 Drawing Sheets

(51) Int. Cl.
    *H01L 23/538*     (2006.01)
    *H01L 21/56*     (2006.01)
    *H01L 25/065*     (2006.01)
    *H01L 21/683*     (2006.01)
    *H01L 23/31*     (2006.01)

(56) References Cited

U.S. PATENT DOCUMENTS

| | | | | |
|---|---|---|---|---|
| 2006/0220209 A1* | 10/2006 | Karnezos | H01L 25/03 | 257/686 |
| 2006/0220210 A1* | 10/2006 | Karnezos | H01L 25/16 | 257/686 |
| 2010/0084754 A1* | 4/2010 | Yoo | H01L 23/5389 | 257/686 |
| 2014/0091471 A1* | 4/2014 | Chen | H01L 25/18 | 257/770 |
| 2015/0084206 A1* | 3/2015 | Lin | H01L 23/5389 | 257/774 |
| 2016/0027764 A1* | 1/2016 | Kim | H01L 24/97 | 257/686 |
| 2017/0229402 A1* | 8/2017 | Yen | H01L 23/3114 | |
| 2018/0061813 A1* | 3/2018 | Hsieh | H01L 23/562 | |
| 2018/0233457 A1* | 8/2018 | Chen | H01L 21/56 | |
| 2019/0148344 A1 | 5/2019 | Uzoh et al. | | |

* cited by examiner

INTERPOSER BETWEEN A CONDUCTIVE SUBSTRATE AND PLURALITY OF SEMICONDUCTOR COMPONENTS

BACKGROUND

1. Field of the Disclosure

The instant disclosure relates to, amongst other things, a semiconductor device package and method of manufacturing the same, and a semiconductor device package having an encapsulant encapsulating a side surface of a conductive substrate and method of manufacturing the same.

2. Description of Related Art

A stacking electronic device package includes two or more electronic components stacked on each other. The stacked electronic components are electrically connected to each other through conductive structures such as solder bumps, and an underfill is normally formed to ensure the joint between the stacked electronic components. The underfill, however, may climb up edges of the electronic component, making it difficult to remove the carrier for temporarily supporting the electronic component.

SUMMARY

According to one example embodiment of the instant disclosure, a semiconductor device package includes a redistribution structure, a conductive substrate and an encapsulant. The conductive substrate is stacked on the redistribution structure. The encapsulant encapsulates a side surface of the conductive substrate.

According to another example embodiment of the instant disclosure, a semiconductor device package includes a conductive substrate, a redistribution structure and an encapsulant. The conductive substrate includes a first surface and the redistribution structure includes a first surface as well. The first surface of the redistribution structure is electrically connected to the first surface of the conductive substrate by a number of contacts. The encapsulant is between the first surface of the conductive substrate and the first surface of the redistribution structure and at least in contact with the first surface of the redistribution structure.

According to another example embodiment of the instant disclosure, a method of manufacturing a semiconductor device package includes: providing a carrier; forming a redistribution structure on the carrier; mounting a conductive substrate on a first surface of the redistribution structure; forming a first encapsulant to encapsulate the first surface of the redistribution structure and a side surface of the conductive substrate; and removing the carrier.

In order to further understanding of the instant disclosure, the following embodiments are provided along with illustrations to facilitate appreciation of the instant disclosure; however, the appended drawings are merely provided for reference and illustration, and do not limit the scope of the instant disclosure.

DETAILED DESCRIPTION

Figure 1:
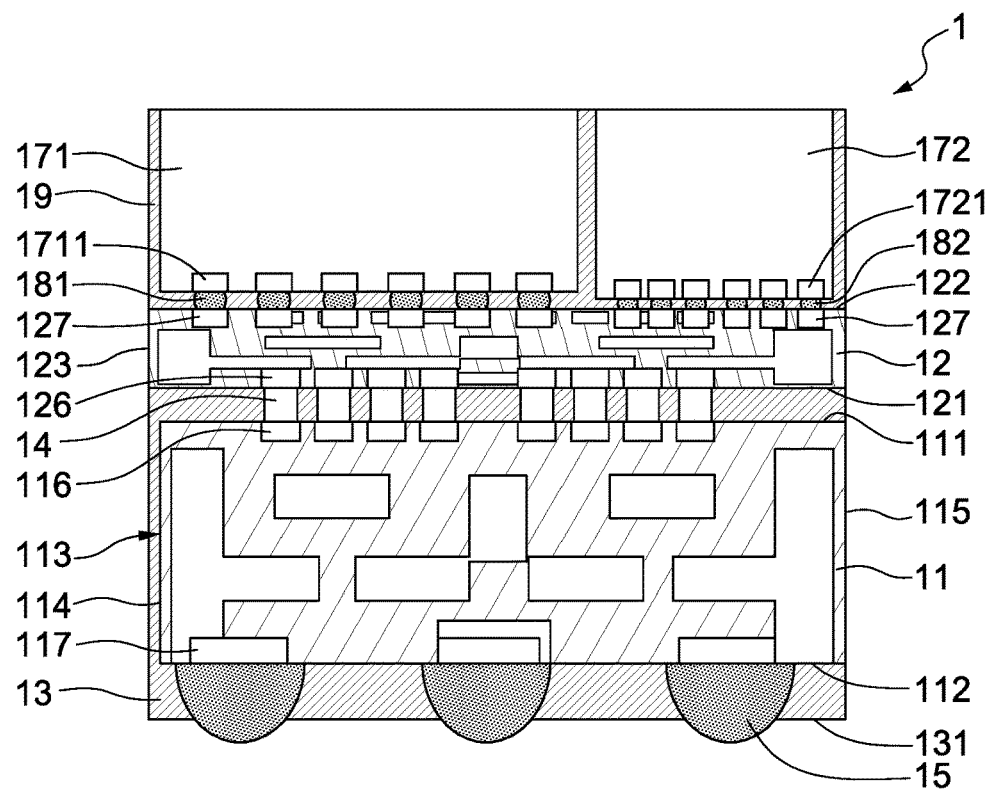
FIG. 1 is a cross-sectional view of a semiconductor device package in accordance with some embodiments of the instant disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In some embodiments, present disclosure provides a stacking semiconductor device package including a redistribution structure and a conductive substrate stacked on each other. The redistribution structure has relatively higher circuit density and larger area than the conductive substrate. This configuration prevents the vulnerable high density redistribution structure from being damaged in a de-carrier operation, and thus the yield and reliability of the electronic device package can be improved.

FIG. 1 is a cross-sectional view of a semiconductor device package 1 in accordance with some embodiments of the present disclosure. As shown in FIG. 1, the semiconductor device 1 includes a redistribution structure (RDL) 12 and a conductive substrate 11 stacked on the redistribution structure 12. The redistribution structure 12 includes a surface 121 (e.g., a first surface or a lower surface), and another surface 122 (e.g., a second surface or an upper surface) opposite to the surface 121. The conductive substrate (also referred to as a substrate) 11 is adjacent to or disposed on the surface 121 and electrically connected to the redistribution structure 11. The conductive substrate 11 includes a surface 111 (e.g., a first surface or an upper surface) facing the surface 121 of the redistribution structure 12, and another surface 112 (e.g., a second surface or a lower surface) opposite to the surface 111. The redistribution structure 12 and the conductive substrate 11 both include circuit layers at least partially embedded therein. In some embodiments, the circuit density of the redistribution structure 12 is higher than the circuit density of the conductive substrate 10. The line width/spacing (L/S) of the redistribution structure 12 is narrower than the L/S of the conductive substrate 11. By way of example, the redistribution structure 12 may include a bumping-level circuit layer. The L/S of the redistribution structure 12 may be, but is not limited to be, between about 2 μm/about 2 μm and about 10 μm/about 10 μm. The bumping-level circuit layer may be patterned and defined by e.g., photolithography-plating-etching technique. The conductive substrate 11 may include a substrate-level circuit layer. The L/S of the conductive substrate 11 may be, but is not limited to be, larger than about 10 μm/about 10 μm. The substrate-level circuit layer may be patterned and defined by e.g., laser drill-plating-etching techniques. In some embodiments, the redistribution structure 12 is thinner than and more fragile than the conductive substrate 11. An area of the redistribution structure 12 is larger than an area of the conductive substrate 11, and thus at least an edge 123 of the redistribution structure 12 laterally protrudes out from a respective edge 113 of the conductive substrate 11. In some embodiments, the redistribution structure 12 and the conductive substrate 11 are polygonal shape such as rectangular shape.

In some embodiments, the redistribution structure 12 may include one or more insulative layers, and one or more conductive wiring layers stacked on one another. The material of the insulative layer(s) may include organic insulative material such as epoxy resin, bismaleimide-triazine (BT) resin, inorganic insulative material such as silicon oxide, silicon nitride, or a combination thereof. The material of the conductive wiring(s) may include metal such as copper (Cu) or the like. The conductive wirings may include first electrical terminals 126 such as bonding pads exposed from the first surface 121 to connect the conductive substrate 11, and second electrical terminals 127 such as bonding pads exposed from the second surface 122 to connect to another electronic component such as a semiconductor die.

In some embodiments, the conductive substrate 11 may be a core substrate or a core-less substrate. The conductive substrate 11 may include one or more insulative layers, and one or more conductive wiring layers stacked on one another. The material of the insulative layer(s) may include organic insulative material such as epoxy resin, bismaleimide-triazine (BT) resin, inorganic insulative material such as silicon oxide, silicon nitride, or a combination thereof. The material of the conductive wiring(s) may include metal such as copper (Cu) or the like. The conductive wirings may include first electrical terminals 116 such as bonding pads exposed from the surface 111 to connect the redistribution structure 12, and second electrical terminals 117 such as bonding pads exposed from the surface 112 to connect an external electronic component such as a printed circuit board (PCB).

The electronic device package 1 may further include a plurality of contacts 14 disposed between and electrically connected to the redistribution structure 12 and the conductive substrate 11. In some embodiments, the contacts 14 may include conductive pillars such as copper pillars, conductive bumps such as solder bumps or the like, and electrically connected to the redistribution structure 12 through the first electrical terminals 126 and electrically connected to the conductive substrate 11 through the first electrical terminals 116.

The electronic device package 1 may further include an encapsulant 13 (e.g., a first encapsulant) encapsulates the surface 121 of the redistribution structure 12, a first side surface 114 and the surfaces 111 and 112 of the conductive substrate 11. As shown in FIG. 1, the first encapsulant 13 is between the surface 121 of the redistribution structure 12 and the surface 111 of the conductive substrate 11. In some embodiments, the first encapsulant 13 is at least in contact with the surface 121 of the redistribution structure 12. Further, the first encapsulant 13 encapsulates the contacts 14 as well. In addition, the first encapsulant 13 exposes a second side surface 115 of the conductive substrate 11. The first encapsulant 13 may include molding compounds such epoxy resin, and fillers such as silicon oxide fillers may be filled in the molding compound. In addition, the first encapsulant 13 may include a molding underfill (MUF) or a capillary underfill (CUF). Since the first encapsulant 13 encapsulates the surface 121 of the redistribution structure 12, the first encapsulant 13 could prevent the first electrical terminals 126 from being corroded by water, oxygen or acid. Accordingly, the reliability of the electronic device package 1 is improved. Further, since the first encapsulant 13 encapsulates first side surface 114 and the surfaces 111 and 112 of the conductive substrate 11, warpage and delamination issues could be reduced.

In some embodiments, the electronic device package 1 may further include a plurality of electrical connections 15 disposed on the surface 112, and electrically connected to the second electrical terminals 117 of the conductive substrate 11. The electrical conductors 15 may include solder balls or solder bumps such as C4 bumps for connecting an external component such as a PCB. The electrical connection 15 is encapsulated by the first encapsulant 13 but a portion of the electrical connection 15 is exposed from and protruded from a surface 131 of the first encapsulant 13, which faces away the conductive substrate 11. Further, as abovementioned, the electrical connection 15 may include a solder connection, such as a solder ball, solder bump, etc. A portion of the solder connection is in contact with the second electrical terminals 117 of the conductive substrate 11 and a maximum width of the portion of the solder connection is wider than a width of the second electrical terminal 117 of the conductive substrate 11.

The electronic device package 1 may further include a first electronic component 171 and a second electronic component 172 adjacent to or disposed on the surface 122 of the redistribution structure 12 and electrically connected to the redistribution structure 12. In some embodiments, the active surface of the first electronic component 171 and/or the active surface of the second electronic component 172 may face the redistribution structure 12. The first electronic component 171 or the second electronic component 172 may include a semiconductor die with embedded circuit layer, and the circuit density of the first electronic component 171 or the second electronic component 172 is higher than the circuit density of the redistribution structure 12. By way of example, the circuit layer of the first electronic component 171 of the second electronic component 172 may include a foundry-level circuit layer with a relatively narrower L/S. By way of example, the L/S of the foundry-level circuit may be less than about 2 μm/about 2 μm. The foundry-level circuit layer may be patterned and defined by e.g., advanced photolithography-plating-etching techniques. The area of the first electronic component 171 or the area of the second electronic component 172 is smaller than the area of the redistribution structure 12, and several first and second electronic components 171 and 172 may be disposed on the redistribution structure 12. In some embodiments, the redistribution structure 12 may be configured as a fan-out RDL or a fan-out circuit layer with respect to the first electronic component 171 and the second electronic component 172. The first electronic component 171 may include a plurality of electrical terminals 1711 such as bonding pads facing the redistribution structure 12 and configured to electrically connect the redistribution structure 12. The second electronic component 172 may include a plurality of electrical terminals 1721 such as bonding pads facing the redistribution structure 12 and configured to electrically connect the redistribution structure 12.

The electronic device package 1 may further include a first set of conductive structures 181 disposed between and electrically connected to the first electronic component 171 and the redistribution structure 12, and a second set of conductive structures 182 disposed between and electrically connected to the second electronic component 172 and the redistribution structure 12. The conductive structures 181 and the conductive structures 182 may include conductive pillars such as copper pillars, conductive bumps such as solder bumps or the like electrically connected to the first electronic component 171 through the electrical terminals 1711, and electrically connected to the second electronic component 172 through the electrical terminals 1721, and electrically connected to the redistribution structure 12 through the second electrical terminals 127. The electronic device package 1 may further include a second encapsulant 19 encapsulating the first electronic component 171, the second electronic component 172 and the surface 122 of the redistribution structure 12. The second encapsulant 19 may encapsulate some or all sidewalls of the first electronic component 171 and the second electronic component 172. The second encapsulant 19 may include molding compounds such epoxy resin, and fillers such as silicon oxide fillers may be filled in the molding compound. In addition, the second encapsulant 19 may include a molding underfill (MUF) or a capillary underfill (CUF). The second encapsulant 19 may further encapsulate the inactive surface of the electronic component 17.

The redistribution structure 12 is relatively thinner than and more vulnerable than the conductive substrate 11. In case the redistribution structure 12 is first singulated from a redistribution substrate and then bonded to the conductive substrate 11, the singulated redistribution structure 12 is supported by a carrier. The underfill between the singulated redistribution structure 12 and the conductive substrate 11, however, would climb up the edge of the redistribution structure 12 and contact the carrier. The underfill would result in difficulties in a de-carrier operation in which the carrier is removed. In some embodiments of the present disclosure, a redistribution substrate including a plurality of non-singulated redistribution structures 12 is supported on the carrier. Further, a mother substrate including a plurality of pre-formed conductive substrates 11 is bonded to the redistribution substrate. After the mother substrate is bounded to the redistribution substrate, the carrier is easily removed and reused.

The electronic device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 2:
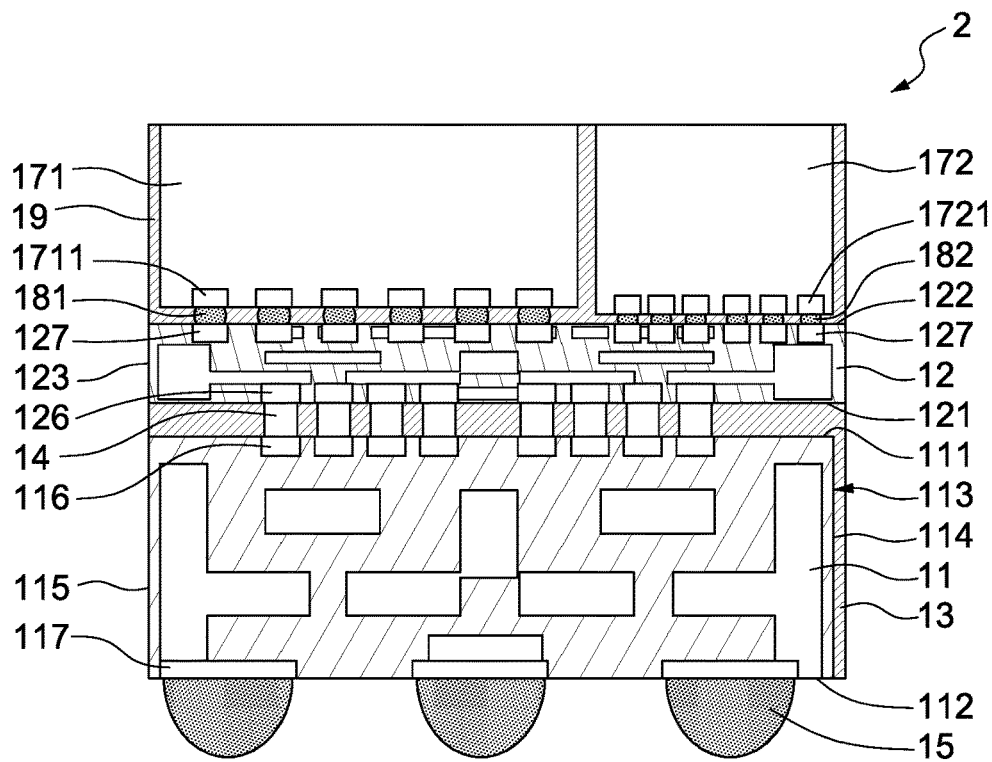
FIG. 2 is a cross-sectional view of a semiconductor device package in accordance with some embodiments of the instant disclosure.

FIG. 2 is a cross-sectional view of an electronic device package 2 in accordance with some embodiments of the present disclosure. As shown in FIG. 2, in contrast to the electronic device package 1 in FIG. 1, the surface 112 of the conductive substrate 11 and the electrical connections 15 are not encapsulated by the first encapsulant 13. The entire surface of the surface 112 of the conductive substrate 11 and the entire electrical connections 15 may be exposed.

Figure 3:
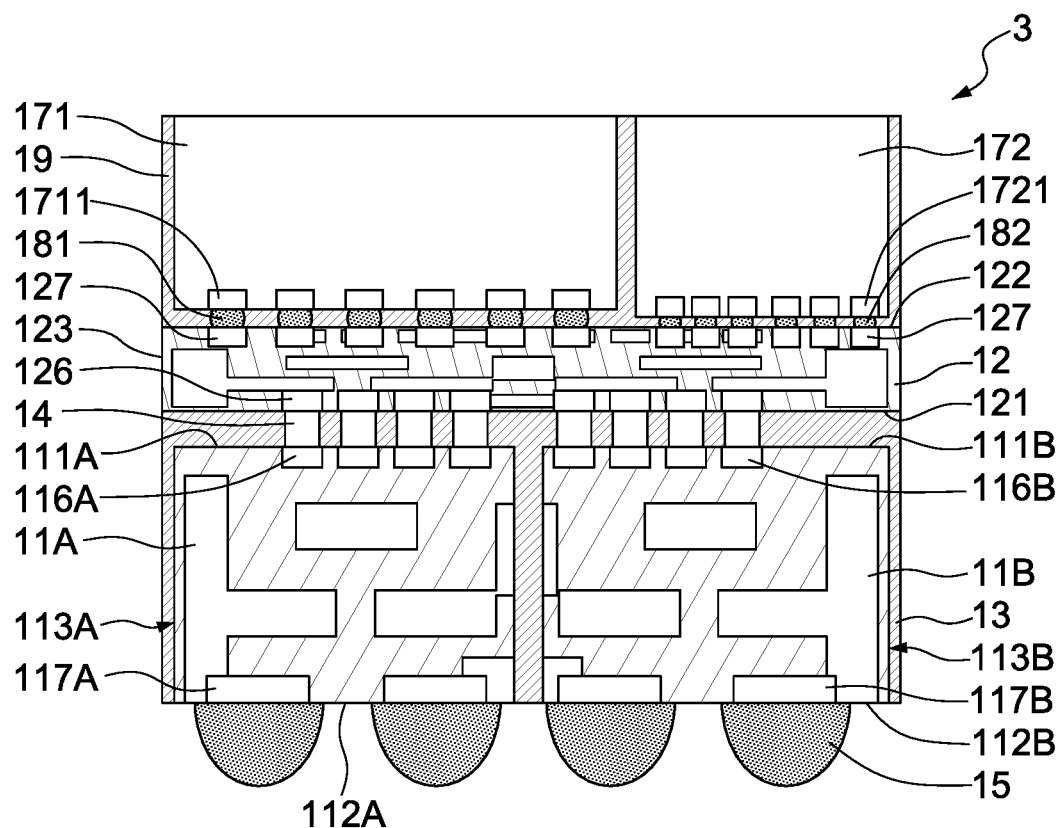
FIG. 3 is a cross-sectional view of a semiconductor device package in accordance with some embodiments of the instant disclosure.

FIG. 3 is a cross-sectional view of an electronic device package 3 in accordance with some embodiments of the present disclosure. As shown in FIG. 3, in contrast to the electronic device package 2 in FIG. 2, the conductive substrate 11 may be singulated to form a first conductive substrate 11A and a second conductive substrate 11B. The first conductive substrate 11A and the second conductive substrate 11B may be partitioned substrates each including circuit with incomplete function. As illustrate in FIG. 3, the first conductive substrate 11A and the second conductive substrate 11B (partitioned substrates) are joined by the first encapsulant 13. Thus, the first encapsulant 13 may encapsulate respective edges 113A of the first conductive substrate 11A and respective edges 113B of the second conductive substrate 11B. Further, the first conductive substrate 11A may include first electrical terminals 116A such as bonding pads exposed from the surface 111A to connect the redistribution structure 12, and second electrical terminals 117A such as bonding pads exposed from the surface 112A to connect an external electronic component such as a printed circuit board (PCB). The second conductive substrate 11B may include first electrical terminals 116B such as bonding pads exposed from the surface 111B to connect the redistribution structure 12, and second electrical terminals 117B such as bonding pads exposed from the surface 112B to connect an external electronic component such as a printed circuit board (PCB). The first conductive substrate 11A and the second conductive substrate 11B can be electrically connected through the redistribution structure 12 to realize their complete function. In addition, two, three or all edges 123 of the redistribution structure 12 laterally protrude out from respective edges 113A of the conductive substrate 11A or respective edges 113B of the conductive substrate 11B.

Figure 4A:
FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N and FIG. 4O illustrate a method of manufacturing a semiconductor device package in accordance with some embodiments of the instant disclosure.
Figure 4B:
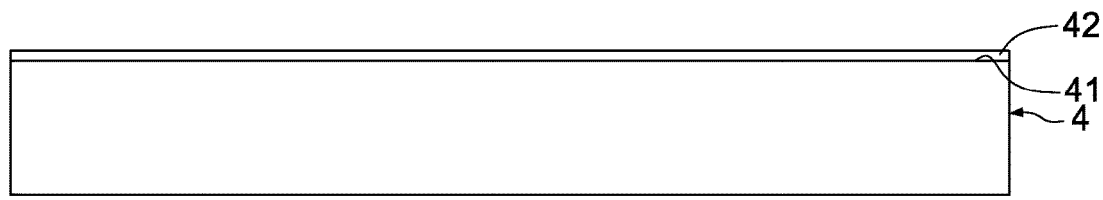

FIG. 4A, FIG. 4B, FIG. 4C, FIG. 4D, FIG. 4E, FIG. 4F, FIG. 4G, FIG. 4H, FIG. 4I, FIG. 4J, FIG. 4K, FIG. 4L, FIG. 4M, FIG. 4N and FIG. 4O illustrate operations of manufacturing an electronic device package 1 in accordance with some embodiments of the present disclosure. As shown in FIG. 4A, a carrier 4 is provided. In FIG. 4B, a releasing layer 42 is provided on a surface 41 of the carrier 4.

Figure 4C:
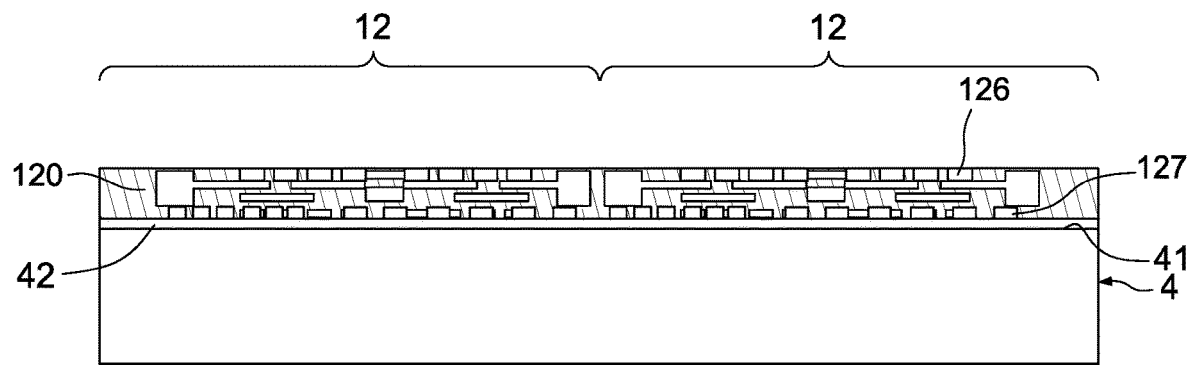

In FIG. 4C, a redistribution substrate 120 is provided. The redistribution substrate 120 includes a plurality of preformed redistribution structures 12. The redistribution substrate 120 is disposed on the releaser layer 42 and thus supported by the carrier 4.

Figure 4D:
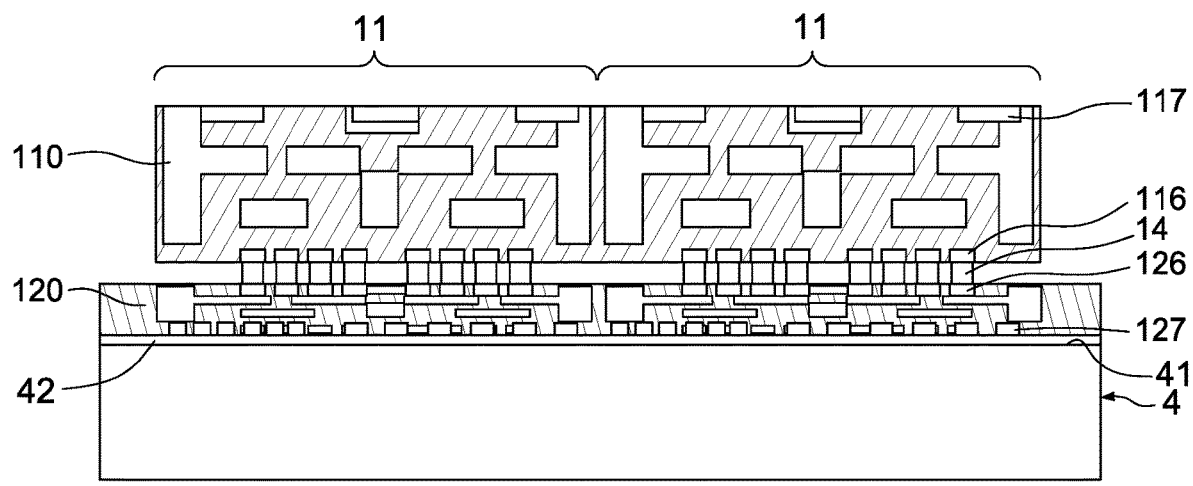

In FIG. 4D, a mother substrate 110 is bonded to the redistribution substrate 120. The mother substrate 110 includes a plurality of pre-formed conductive substrates 11. In some embodiments, a plurality of contacts 14 may be formed on the first electrical terminals 116 of the conductive substrate 11. At least some of the plurality of conductive substrates 11 are mounted on the redistribution substrate 120, and electrically connected to the redistribution structures 12 through the contacts 14.

Figure 4E:
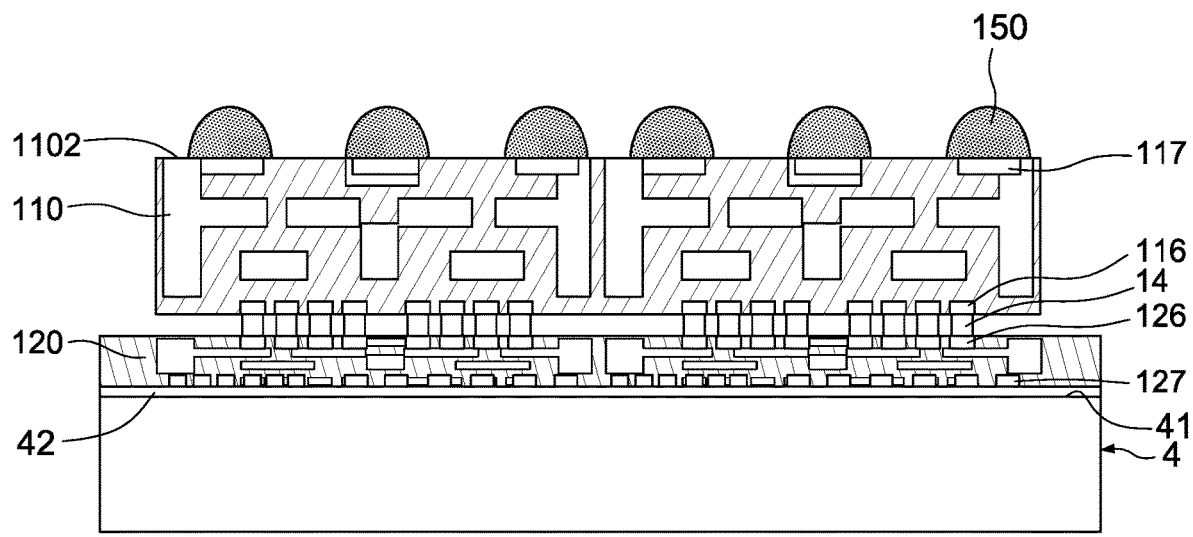

In FIG. 4E, a plurality of solder connections 150 are disposed on the surface 1102 of the mother substrate 110 and in contact with the second electrical terminals 117 of the conductive substrates 11.

Figure 4F:
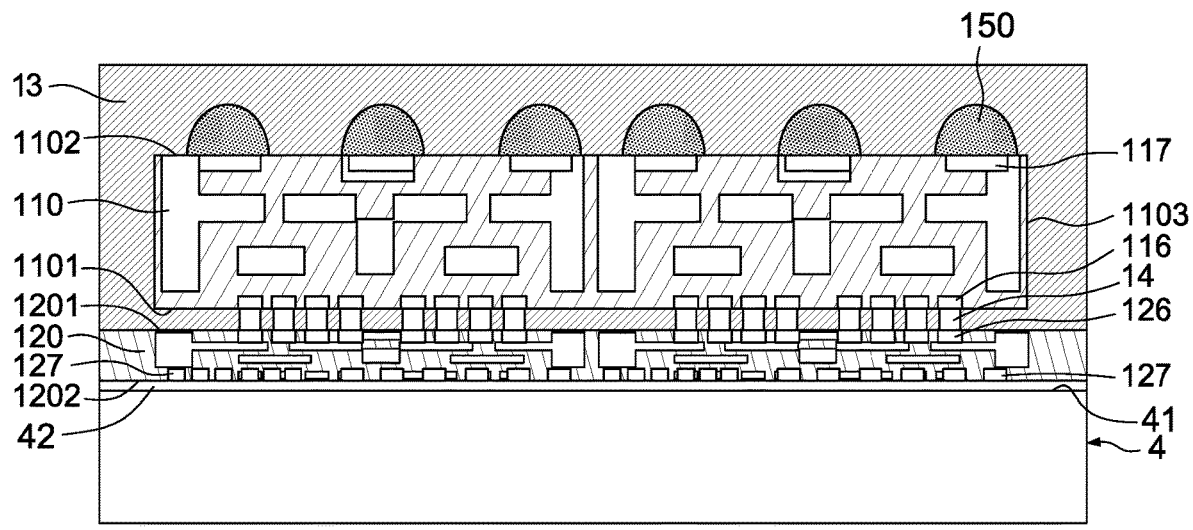

In FIG. 4F, a first encapsulant 13 is formed to encapsulate the surface 1201 of the redistribution substrate 120, the surface 1101, the surface 1102 opposite to the surface 1101 and side surface 1103 of the mother substrate 110, the solder connections 150 and the first contacts 14.

Figure 4G:
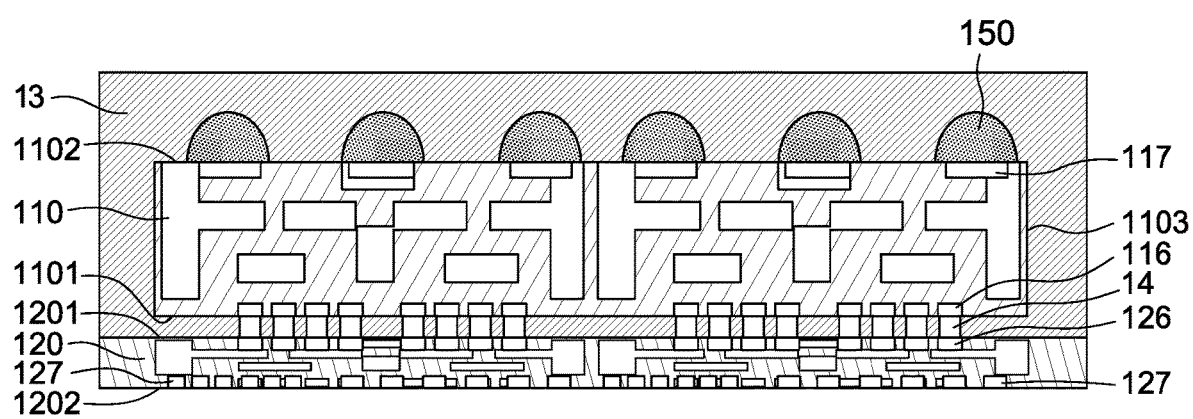

In FIG. 4G, the carrier 4 is removed. Thus, a surface 1202 of the redistribution substrate 120, which is opposite to the surface 1201 of the redistribution substrate 120, is exposed.

Figure 4H:
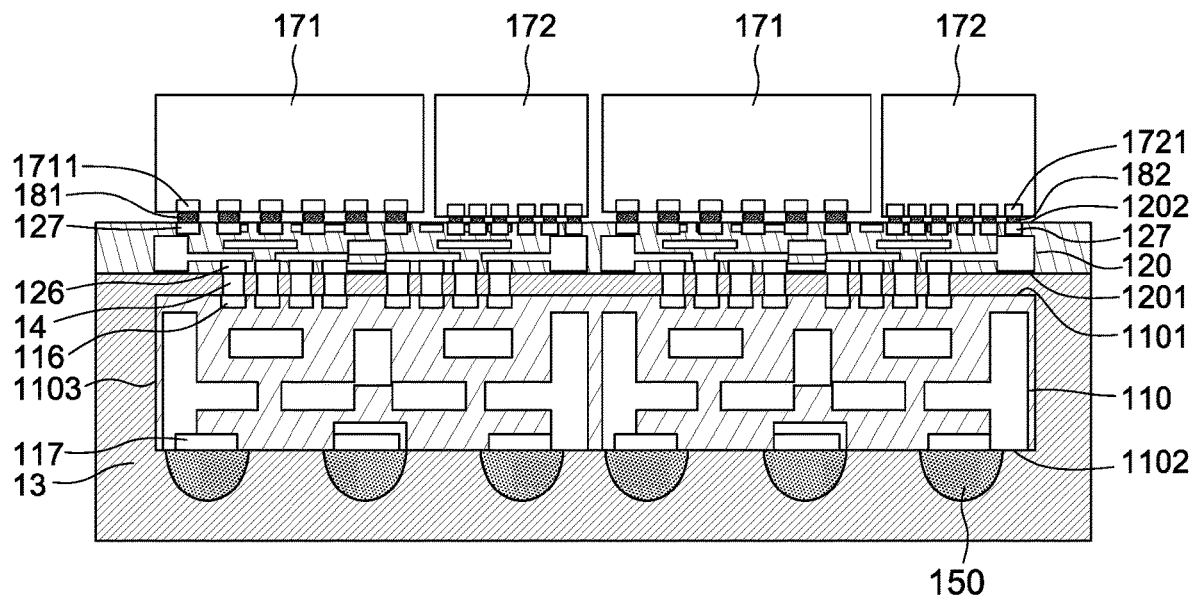

In FIG. 4H, first and second electronic components 171 and 172 are mounted on the surface 1202 of the redistribution substrate 120 and electrically connected to the redistribution structures 12 through the first and second conductive structures 181 and 182.

Figure 4I:
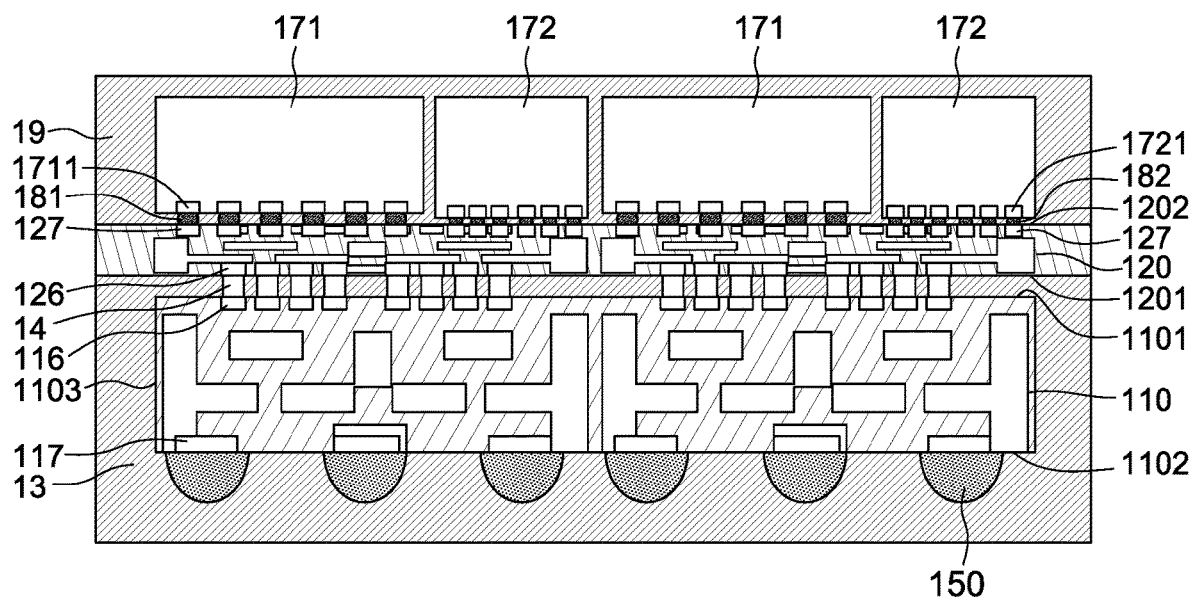

In FIG. 4I, a second encapsulant 19 is formed to encapsulate the surface 1202 of the redistribution substrate 120 and the first and second electronic components 171 and 172.

Figure 4J:
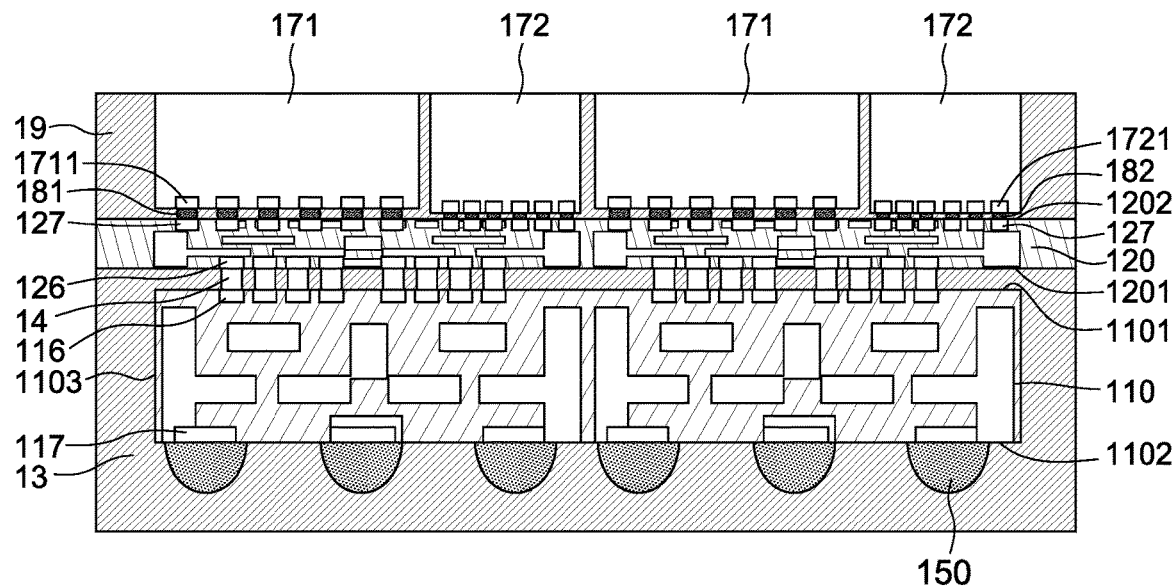

In FIG. 4J, a portion of the second encapsulant 19 is removed such that the tops of the first and second electronic components 171 and 172 may be exposed from the second encapsulant 19.

Figure 4K:
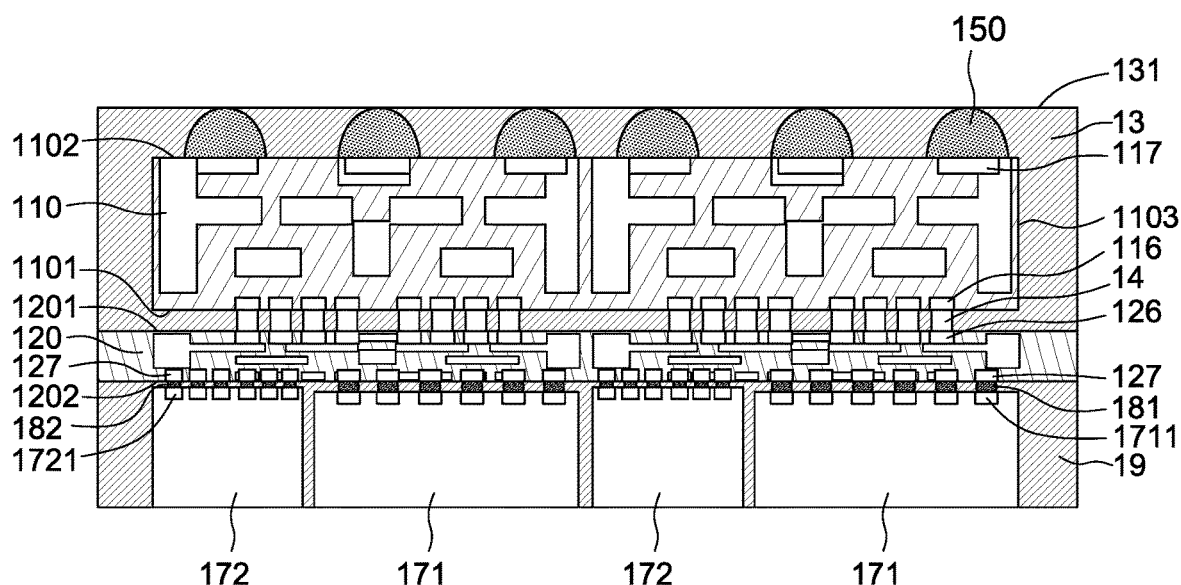

In FIG. 4K, a portion of the first encapsulant 13 is removed such that the tops of the solder connections 150 may be adjacent to the surface 131 of the first encapsulant 13, which faces away from the mother substrate 110.

Figure 4L:
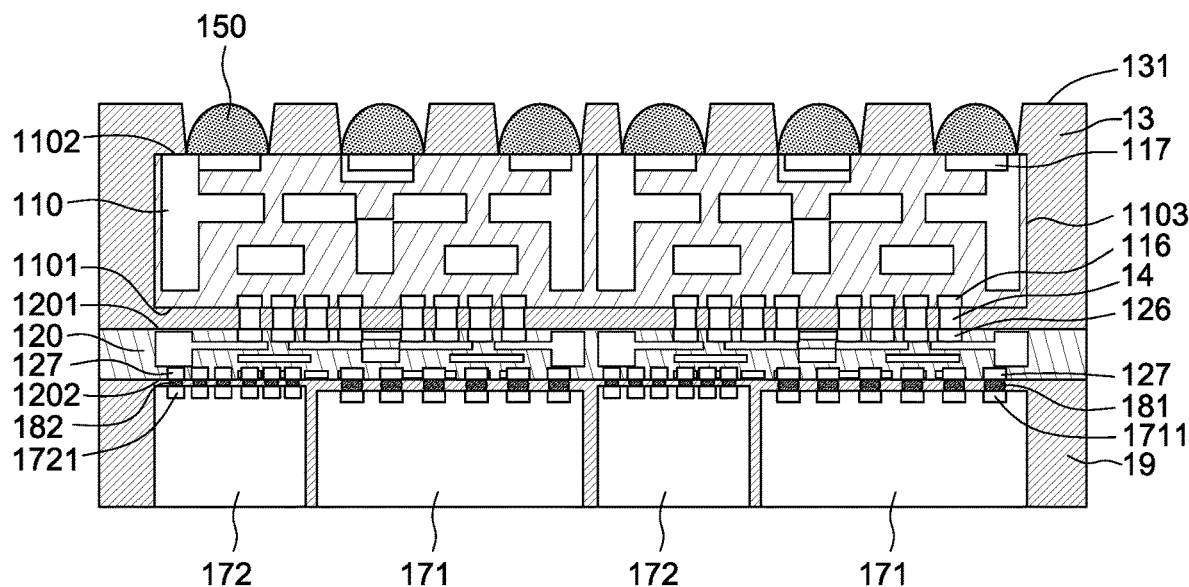

In FIG. 4L, the surface 131 of the first encapsulant 13 is drilled by a laser ablation operation, a plasma ablation operation or other suitable techniques such that the solder connections 150 are exposed from the first encapsulant 13.

Figure 4M:
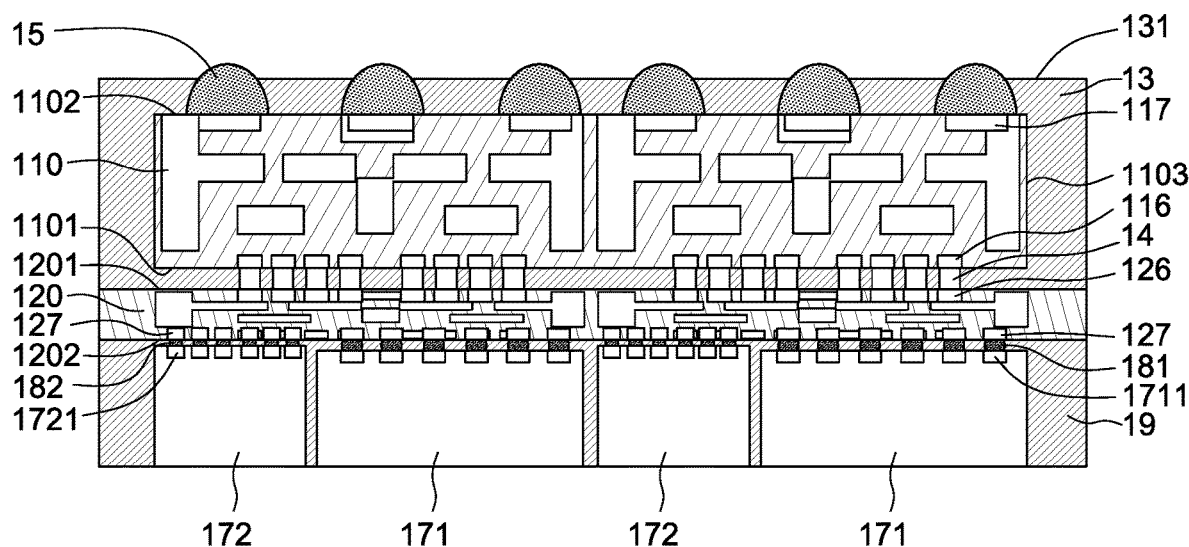

In FIG. 4M, the solder connections 150 are reflowed to form the electrical connections 15, and a portion of the electrical connection 15 is protruded from the surface 131 of the first encapsulant 13. If the height of the protruded portion of the electrical connection 15 is not enough, a solder material can be added to the electrical connection 15 to facilitate connection with an external electronic component such as PCB.

Figure 4N:
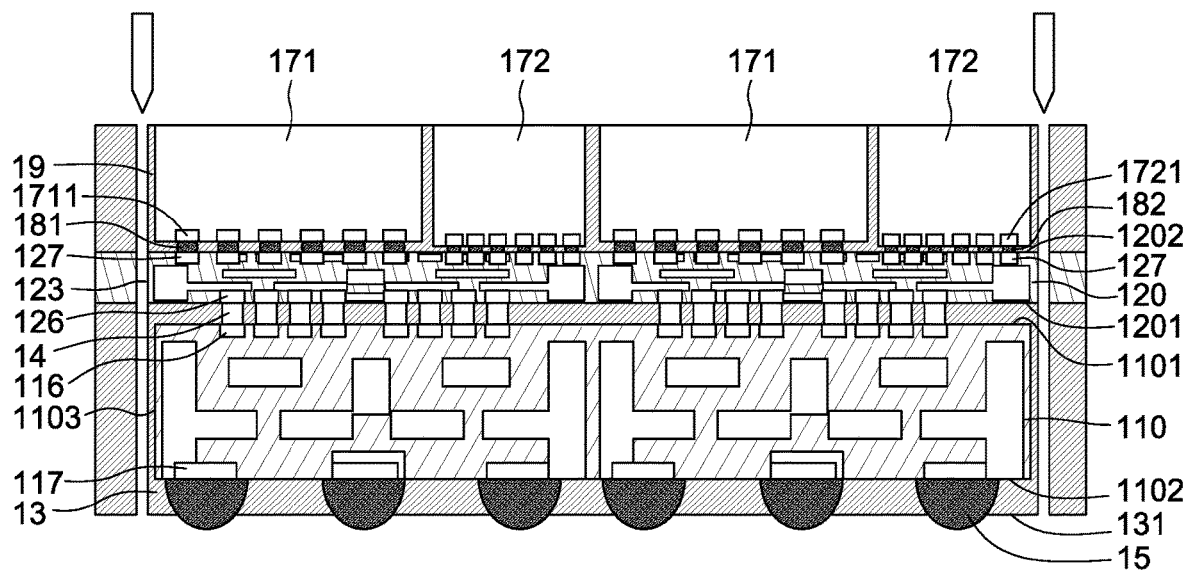

In FIG. 4N, the surplus portions of the second encapsulant 19, the redistribution substrate 120 and the first encapsulant 13 are removed.

Figure 4O:
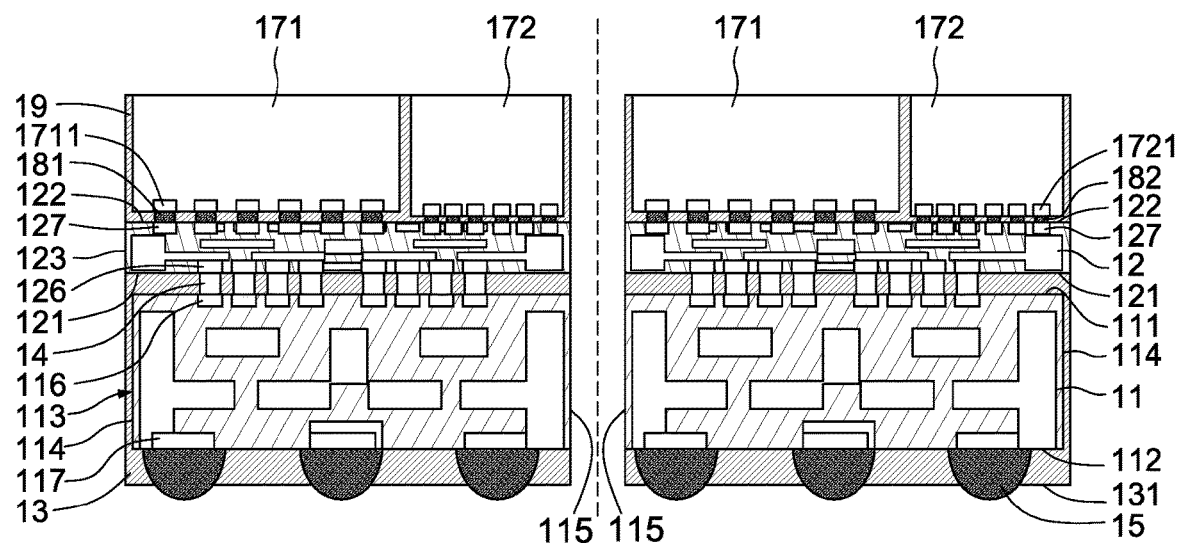

In FIG. 4O, a singulation is performed to divide the redistribution substrate 120 into a plurality of redistribution structures 12 and divide the mother substrate 110 into a plurality of conductive substrates 11, which are mounted on the redistribution structures 12 respectively, to form the semiconductor device package 1 as illustrated in FIG. 1.

Figure 5A:
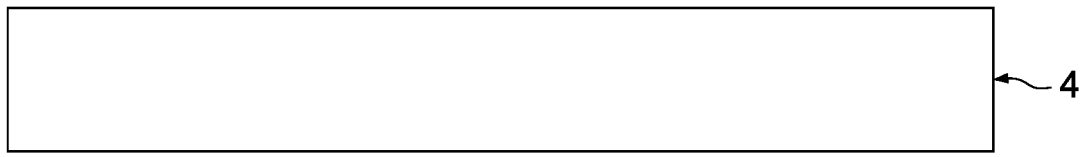
FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L illustrate a method of manufacturing a semiconductor device package in accordance with some embodiments of the instant disclosure.

FIG. 5A, FIG. 5B, FIG. 5C, FIG. 5D, FIG. 5E, FIG. 5F, FIG. 5G, FIG. 5H, FIG. 5I, FIG. 5J, FIG. 5K and FIG. 5L illustrate operations of manufacturing an electronic device package 2 in accordance with some embodiments of the present disclosure. As shown in FIG. 5A, a carrier 4 is provided.

Figure 5B:

In FIG. 5B, a releasing layer 42 is provided on a surface 41 of the carrier 4.

Figure 5C:
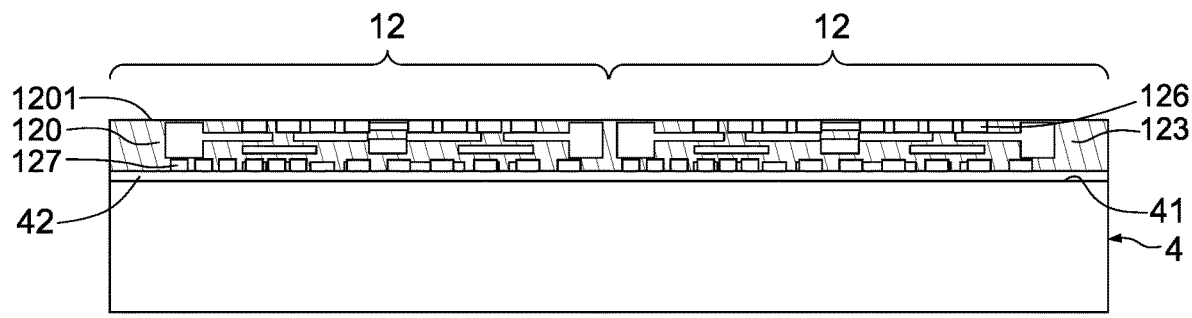

In FIG. 5C, a redistribution substrate 120 is provided. The redistribution substrate 120 includes a plurality of preformed redistribution structures 12. The redistribution substrate 120 is disposed on the releaser layer 42 and thus supported by the carrier 4.

Figure 5D:
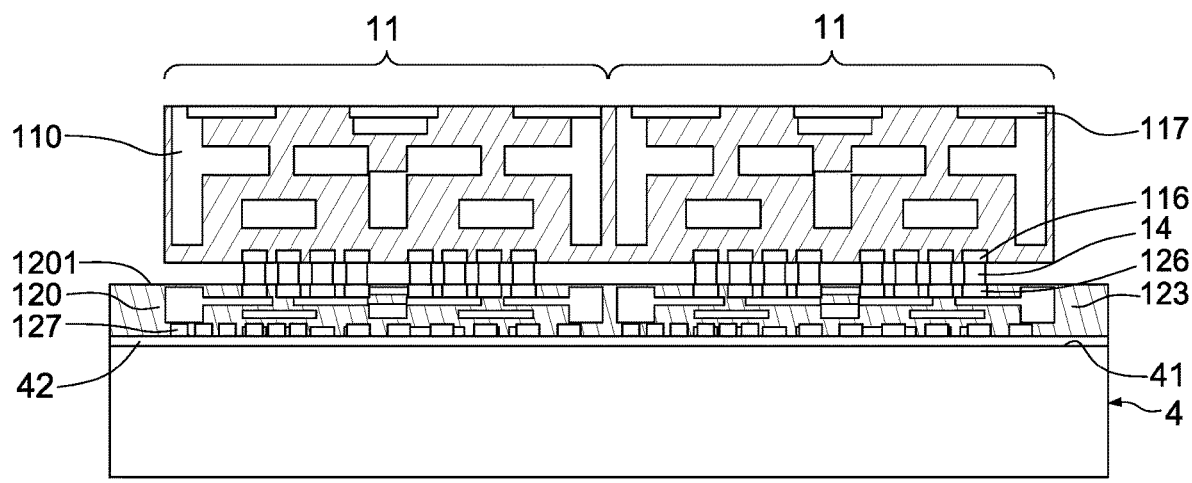

In FIG. 5D, a mother substrate 110 is bonded to the redistribution substrate 120. The mother substrate 110 includes a plurality of pre-formed conductive substrates 11. In some embodiments, a plurality of contacts 14 may be formed on the first electrical terminals 126 of the conductive substrate 11. At least some of the plurality of conductive substrates 11 are mounted on the redistribution substrate 120, and electrically connected to the redistribution structures 12 through the contacts 14.

Figure 5E:
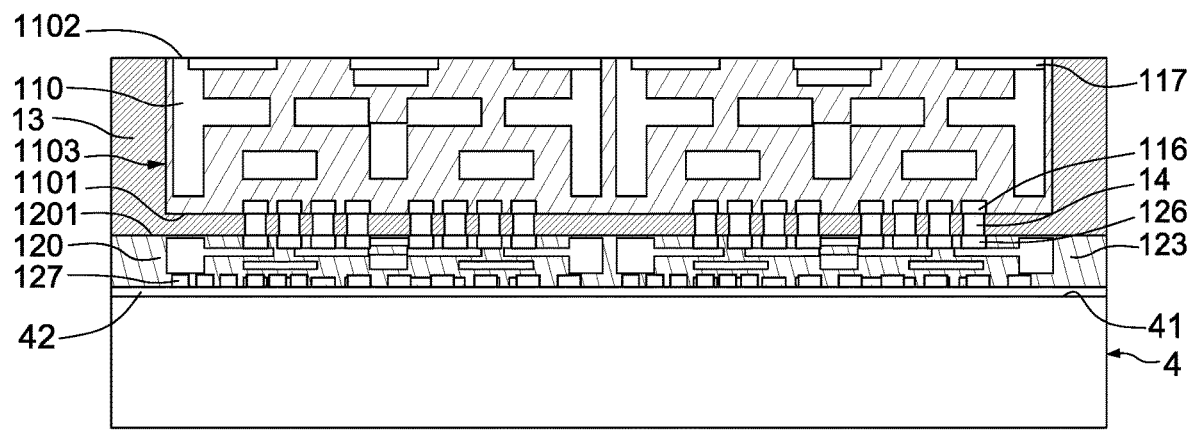

In FIG. 5E, a first encapsulant 13 is formed to encapsulate the surface 1201 of the redistribution substrate 120, the surface 1101, the surface 1102 opposite to the surface 1101 and side surface 1103 of the mother substrate 110 and the contacts 14.

Figure 5F:
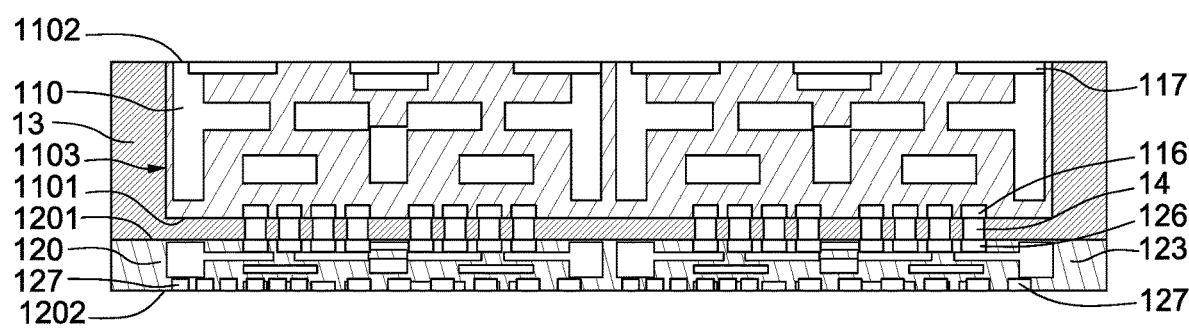

In FIG. 5F, the carrier 4 is removed. Thus, a surface 1202 of the redistribution substrate 120, which is opposite to the surface 1201 of the redistribution substrate 120, is exposed.

Figure 5G:
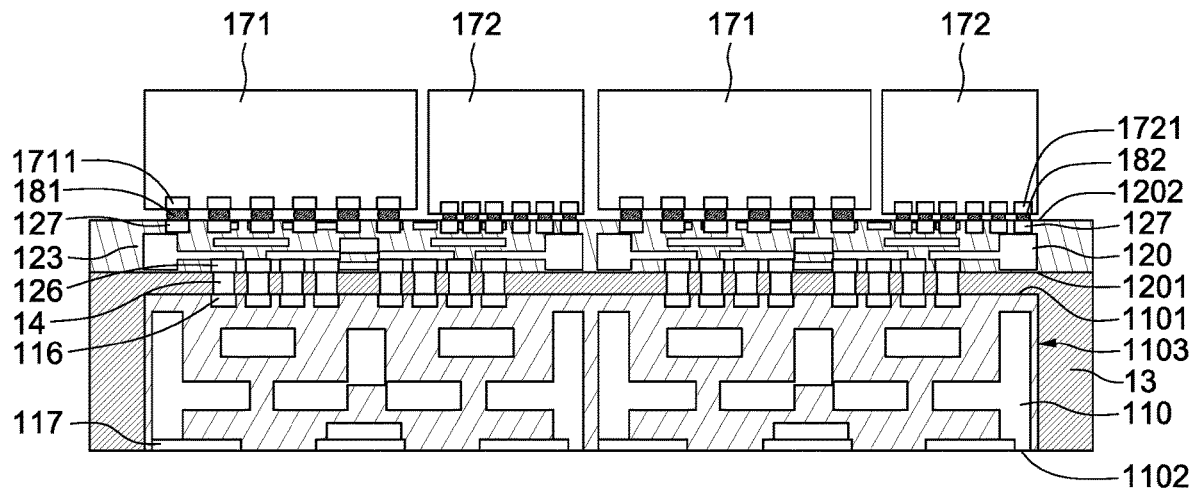

In FIG. 5G, first and second electronic components 171 and 172 are mounted on the surface 1202 of the redistribution substrate 120 and electrically connected to the redistribution structures 12 through the first and second conductive structures 181 and 182.

Figure 5H:
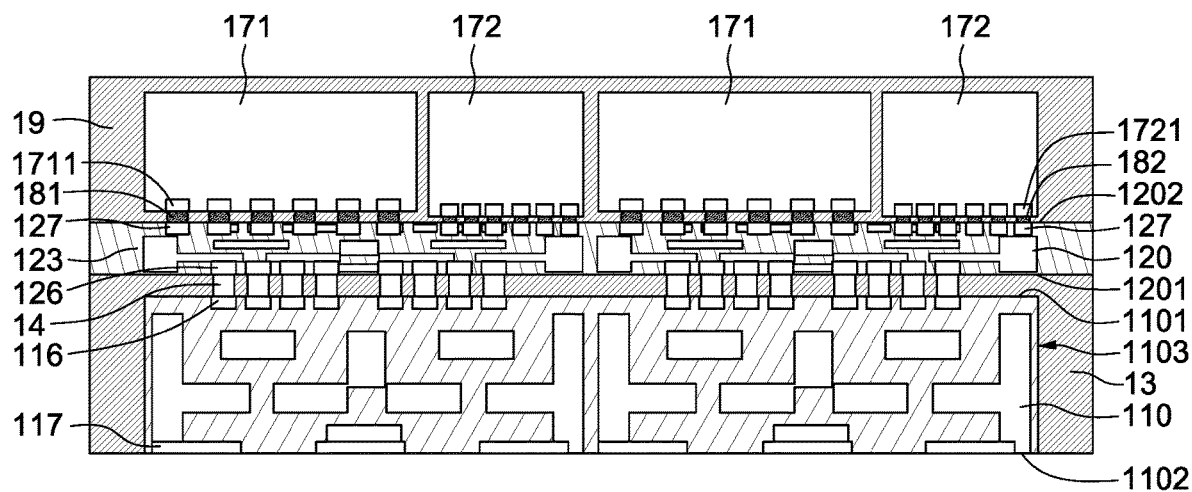

In FIG. 5H, a second encapsulant 19 is formed to encapsulate the surface 1202 of the redistribution substrate 120 and the electronic components 17.

Figure 5I:
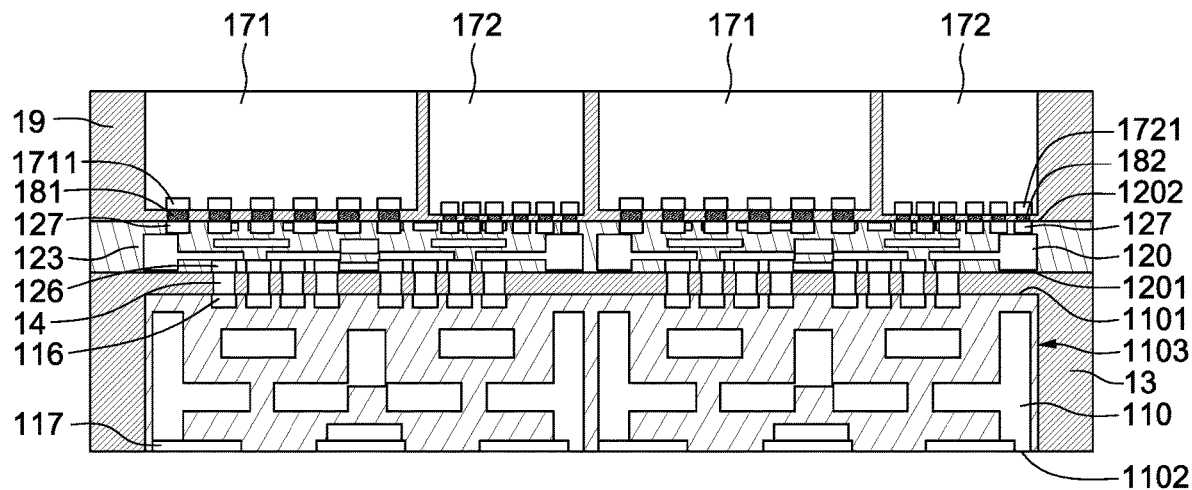

In FIG. 5I, a portion of the second encapsulant 19 is removed such that the tops of the electronic components 17 may be exposed from the second encapsulant 19.

Figure 5J:
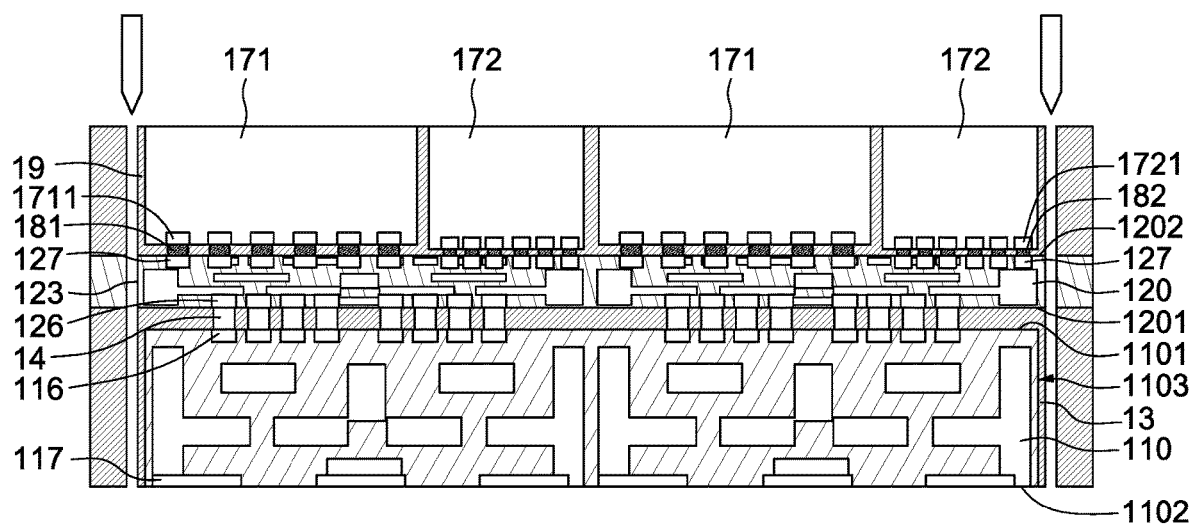

In FIG. 5J, the surplus portions of the second encapsulant 19, the redistribution substrate 120 and the first encapsulant 13 are removed.

Figure 5K:
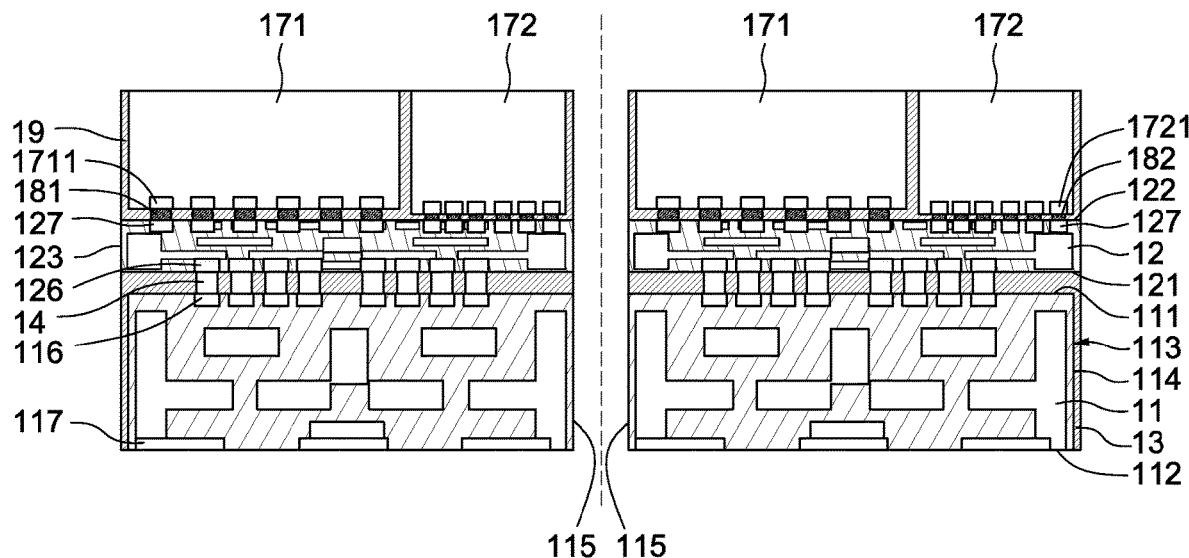

In FIG. 5K, a singulation 5 is performed to divide the redistribution substrate 120 into a plurality of redistribution structures 12 and divide the mother substrate 110 into a plurality of conductive substrates 11, which are mounted on the redistribution structures 12 respectively.

Figure 5L:
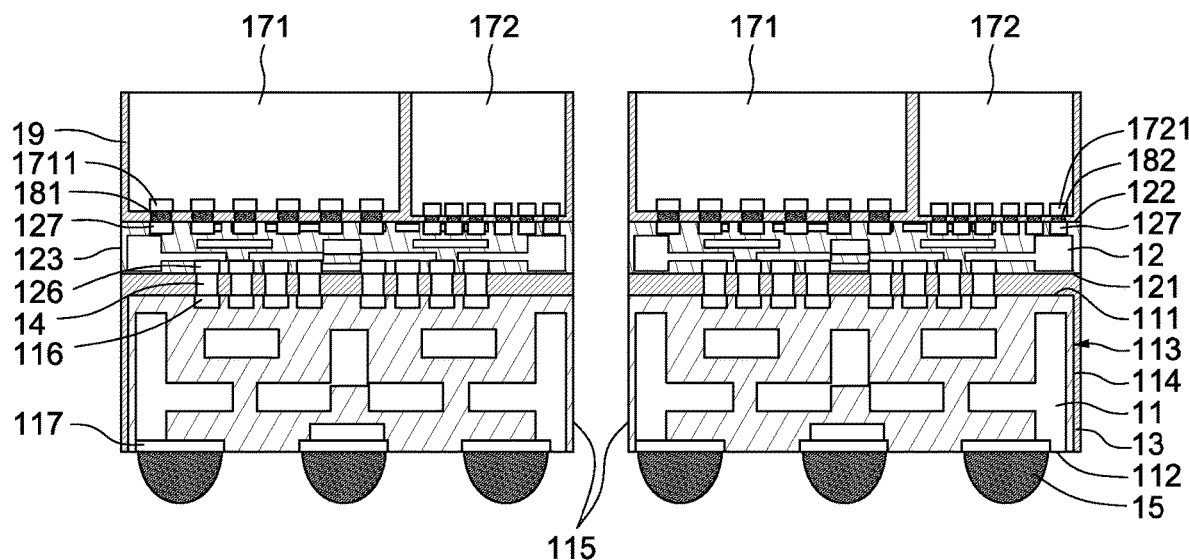

In FIG. 5L, a plurality of electric connections 15 are disposed on the surface 1102 of the mother substrate 110 and in contact with the second electrical terminals 117 of the conductive substrates 11 to form the semiconductor device package 2 as illustrated in FIG. 2.

Figure 6A:
FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L and FIG. 6M illustrate a method of manufacturing a semiconductor device package in accordance with some embodiments of the instant disclosure.
Figure 6B:
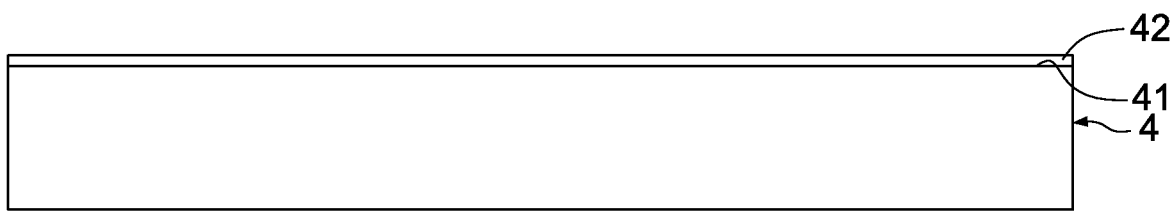
Figure 6C:
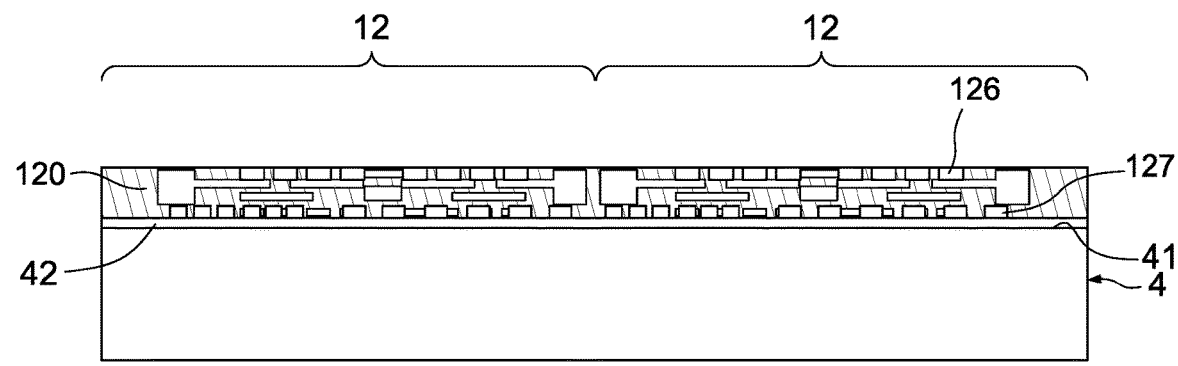
Figure 6D:
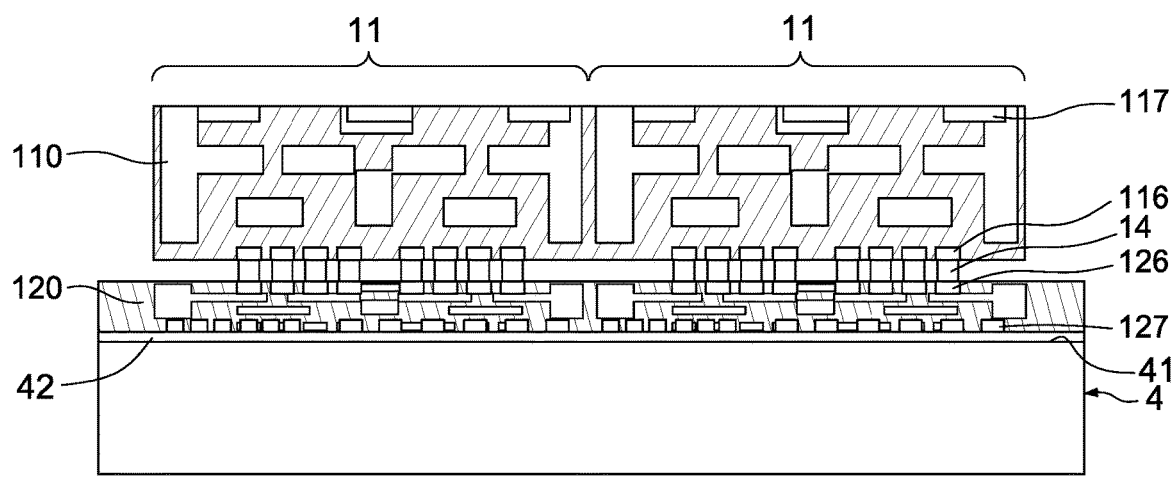
Figure 6E:
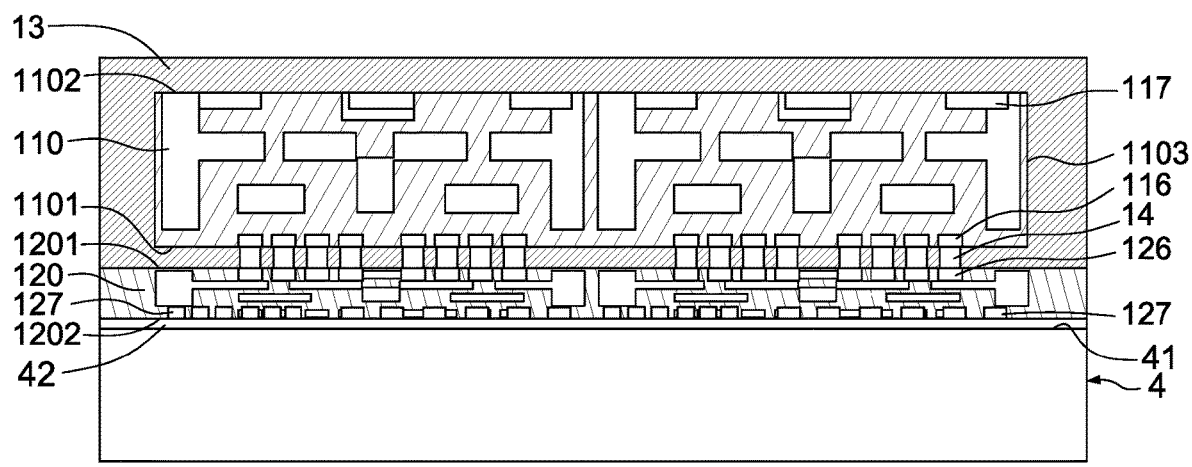
Figure 6F:
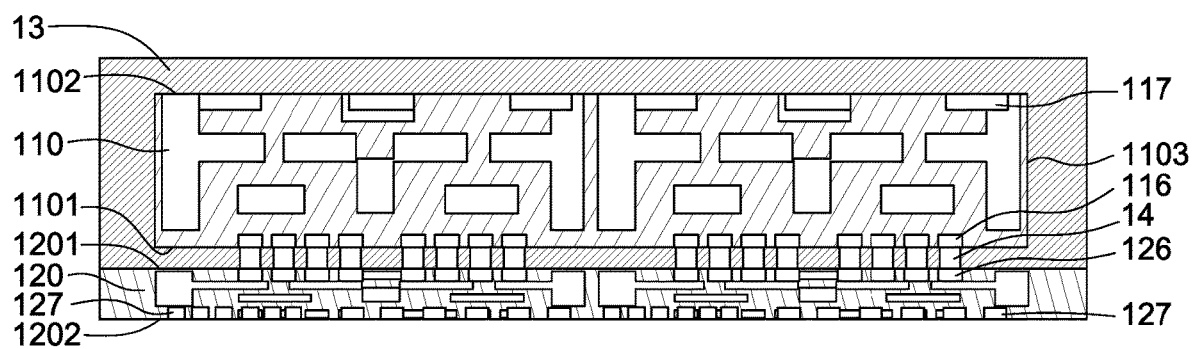
Figure 6G:
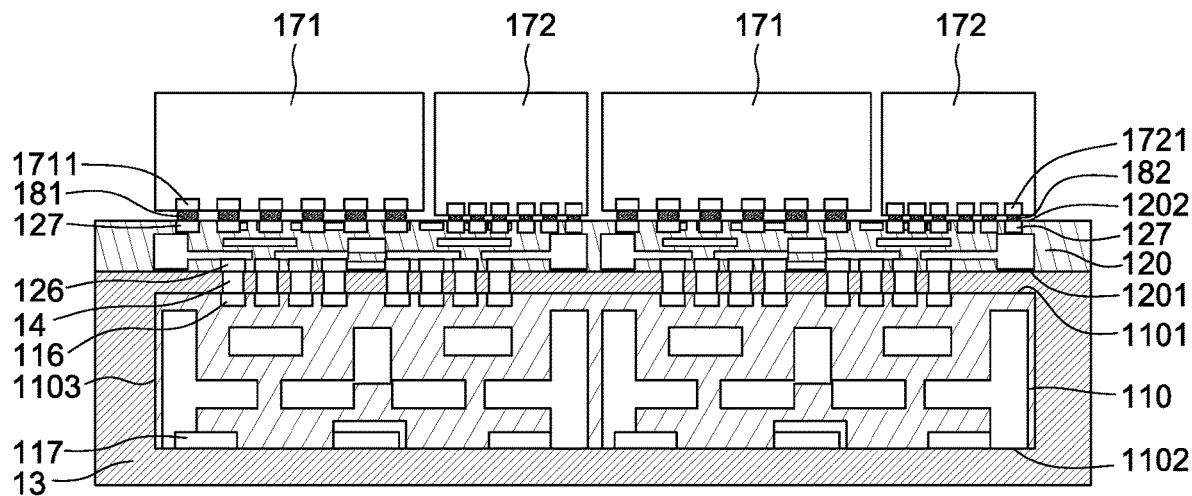
Figure 6H:
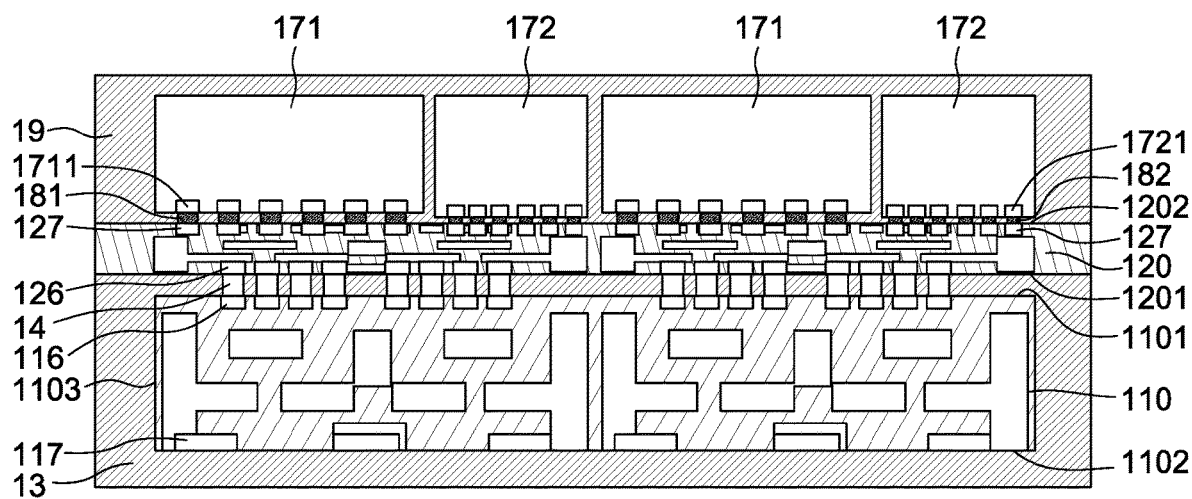
Figure 6I:
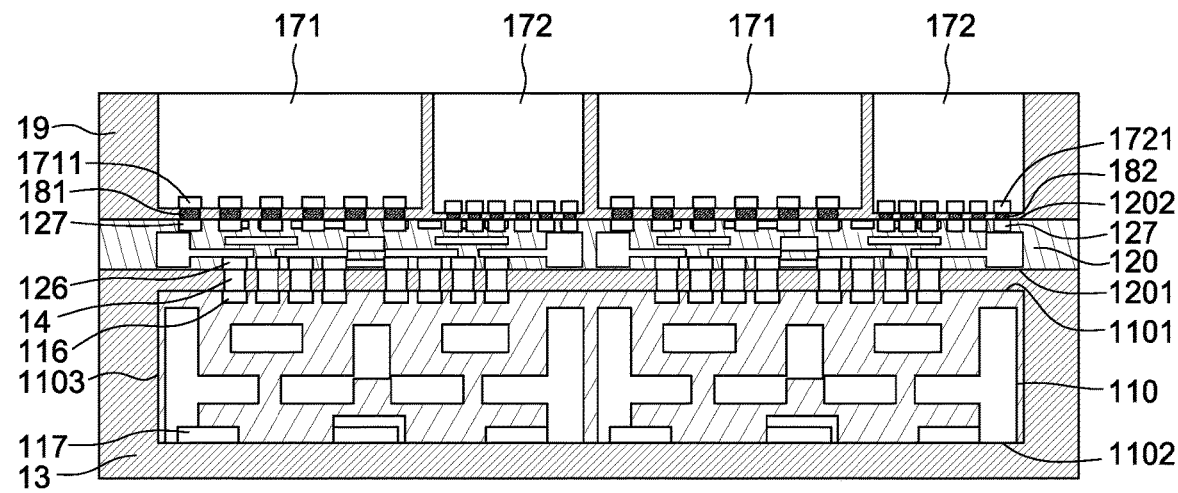
Figure 6J:
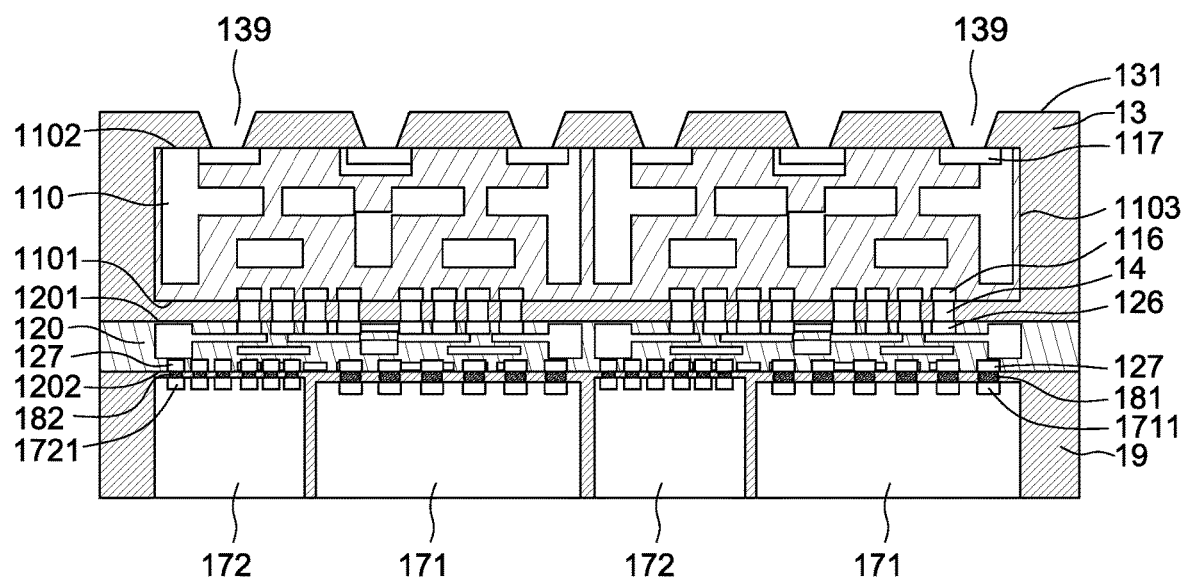
Figure 6K:
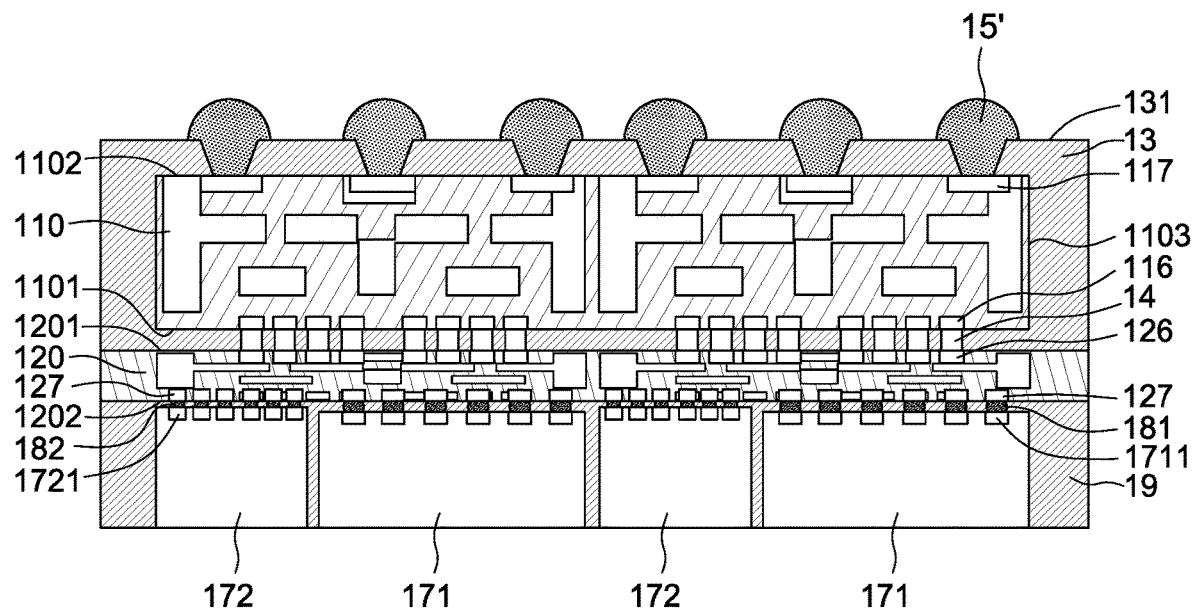
Figure 6L:
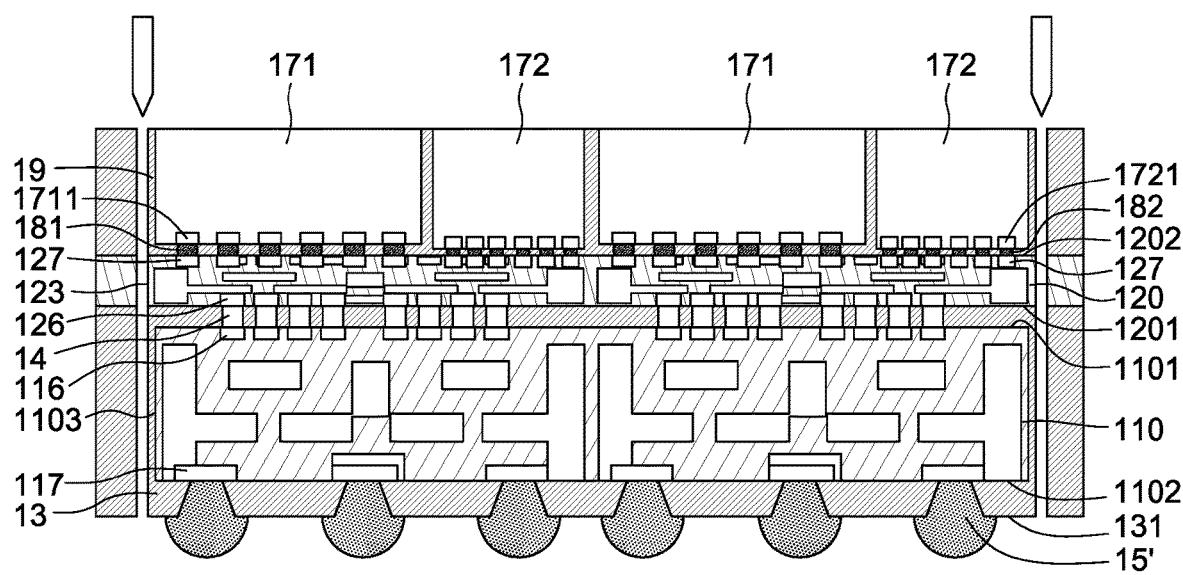
Figure 6M:
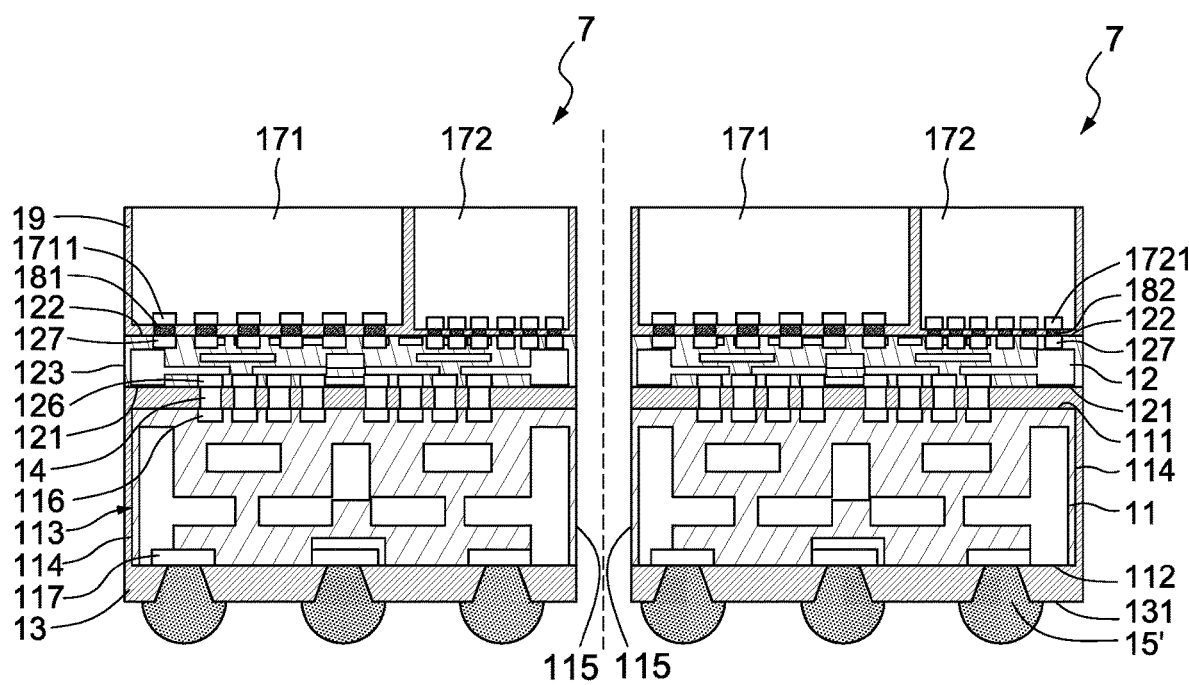

FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L and FIG. 6M illustrate operations of manufacturing an electronic device package 7 in accordance with some embodiments of the present disclosure (see FIG. 6M). As shown in FIG. 6A, a carrier 4 is provided. In FIG. 6B, a releasing layer 42 is provided on a surface 41 of the carrier 4.

In FIG. 6C, a redistribution substrate 120 is provided. The redistribution substrate 120 includes a plurality of preformed redistribution structures 12. The redistribution substrate 120 is disposed on the releaser layer 42 and thus supported by the carrier 4.

In FIG. 6D, a mother substrate 110 is bonded to the redistribution substrate 120. The mother substrate 110 includes a plurality of pre-formed conductive substrates 11. In some embodiments, a plurality of contacts 14 may be formed on the first electrical terminals 116 of the conductive substrate 11. At least some of the plurality of conductive substrates 11 are mounted on the redistribution substrate 120, and electrically connected to the redistribution structures 12 through the contacts 14.

In FIG. 6E, a first encapsulant 13 is formed to encapsulate the surface 1201 of the redistribution substrate 120, the surface 1101, the surface 1102 opposite to the surface 1101 and side surface 1103 of the mother substrate 110 and the first contacts 14.

In FIG. 6F, the carrier 4 is removed. Thus, a surface 1202 of the redistribution substrate 120, which is opposite to the surface 1201 of the redistribution substrate 120, is exposed.

In FIG. 6G, first and second electronic components 171 and 172 are mounted on the surface 1202 of the redistribution substrate 120 and electrically connected to the redistribution structures 12 through the first and second conductive structures 181 and 182.

In FIG. 6H, a second encapsulant 19 is formed to encapsulate the surface 1202 of the redistribution substrate 120 and the first and second electronic components 171 and 172.

In FIG. 6I, a portion of the second encapsulant 19 is removed such that the tops of the first and second electronic components 171 and 172 may be exposed from the second encapsulant 19.

In FIG. 6J, the surface 131 of the first encapsulant 13 is drilled by a laser ablation operation, a plasma ablation operation or other suitable techniques such that openings 139 are formed on the surface 131 of the first encapsulant 13 and the second electrical terminals 117 are exposed from the first encapsulant 13.

In FIG. 6K, a number of electrical connections 15' are formed in the openings 139 and connected to the second electrical terminals 117. The electrical connections 15' are protruded from the surface 131 of the first encapsulant 13.

In FIG. 6L, the surplus portions of the second encapsulant 19, the redistribution substrate 120 and the first encapsulant 13 are removed.

In FIG. 6M, a singulation is performed to divide the redistribution substrate 120 into a plurality of redistribution structures 12 and divide the mother substrate 110 into a plurality of conductive substrates 11, which are mounted on the redistribution structures 12 respectively, to form the semiconductor device package 7.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic device package, comprising:
a redistribution structure with a first surface and a second surface opposite to the first surface;
a conductive substrate stacked on the first surface of the redistribution structure and having a first surface facing the first surface of the redistribution structure;
a plurality of contacts between the first surface of the redistribution structure and the first surface of the conductive substrate;
a first encapsulant encapsulating the conductive substrate and the contacts; and
an electronic component disposed on the second surface of the redistribution structure;
wherein a thickness of the conductive substrate is greater than a thickness of the redistribution structure.

2. The electronic device package of claim 1, wherein the first encapsulant exposes a first side surface of the conductive substrate.

3. The electronic device package of claim 2, wherein the first side surface of the conductive substrate is substantially coplanar with a side surface of the redistribution structure.

4. The electronic device package of claim 1, wherein the first encapsulant is arranged between the redistribution structure and the conductive substrate and configured to encapsulate side surfaces of the contacts.

5. The electronic device package of claim 1, wherein the first encapsulant contacts the first surface of the redistribution structure and a second surface of the conductive substrate, which is opposite the first surface of the conductive substrate.

6. The electronic device package of claim 1, further comprising an electrical connection disposed on a second surface of the conductive substrate, which is opposite the first surface of the conductive substrate.

7. The electronic device package of claim 6, wherein the first encapsulant encapsulates the electrical connection, and wherein a portion of the electrical connection is protruded from a first surface of the first encapsulant.

8. The electronic device package of claim 6, wherein the conductive substrate further comprises an electrical terminal exposed from the second surface of the conductive substrate and electrically connected to the electrical connection, the electrical connection comprises a solder connection, and a portion of the solder connection is in contact with an exposed surface of the electrical terminal.

9. The electronic device package of claim 8, wherein a width of the portion of the solder connection is wider than a width of the electrical terminal.

10. The electronic device package of claim 1, wherein a cross-sectional width of the redistribution structure is greater than a cross-sectional width of the conductive substrate, and the first encapsulant is configured to contact a second side surface of the conductive substrate.

11. The electronic device package of claim 1, further comprising a second encapsulant disposed on the second surface of the redistribution structure and encapsulating the electronic component.

12. An electronic device package, comprising:
a conductive substrate comprising a first surface;
a redistribution structure comprising a first surface facing the first surface of the conductive substrate, wherein the first surface of the redistribution structure is electrically connected to the first surface of the conductive substrate by a contact;
a first encapsulant between the first surface of the conductive substrate and the first surface of the redistribution structure and in contact with the first surface of the redistribution structure and encapsulating the contact; and
a plurality of electronic components disposed on a second surface of the redistribution structure, which is opposite to the first surface of the redistribution structure;
wherein a cross-sectional width of the redistribution structure is greater than a cross-sectional width of the conductive substrate, and wherein the first encapsulant further encapsulates a side surface of the conductive substrate.

13. The electronic device package of claim 12, wherein the first encapsulant comprises a molding underfill.

14. The electronic device package of claim 12, further comprising an electrical connection disposed on a second surface of the conductive substrate, wherein the second surface is opposite the first surface of the conductive substrate.

15. The electronic device package of claim 14, wherein the conductive substrate further comprises an electrical terminal exposed from the second surface of the conductive substrate and electrically connected to the electrical connection, the electrical connection comprises a solder connection, and a portion of the solder connection is in contact with an exposed surface of the electrical terminal.

16. The electronic device package of claim 15, wherein a width of the portion of the solder connection is wider than a width of the electrical terminal.

17. The electronic device package of claim 12, further comprising a second encapsulant disposed on the second surface of the redistribution structure and encapsulating the electronic components.

18. The electronic device package of claim 12, further comprising a first electrical connection configured to connect one of the electronic components and the redistribution structure and a second electrical connection configured to connect another one of the electronic components and the redistribution structure, and wherein a cross-sectional width of the first electrical connection is greater than a cross-sectional width of the second electrical connection.

19. A method for manufacturing an electronic device package, comprising:
providing a carrier;
forming a redistribution structure on the carrier;
mounting a conductive substrate on a first surface of the redistribution structure;
forming a first encapsulant to encapsulate the first surface of the redistribution structure and a side surface of the conductive substrate;
removing the carrier;
disposing an electronic component on a second surface of the redistribution structure, which is opposite the first surface of the redistribution structure, and
forming a second encapsulant to encapsulate the electronic component and the second surface of the redistribution structure.

20. The method of claim 19, further comprising disposing an electronic connection on the conductive substrate prior to forming the first encapsulant.

21. The method of claim 19, further comprising singulating the redistribution structure and the conductive substrate.

* * * * *